(12) United States Patent  (10) Patent No.: US 8,350,598 B2
Chuang  (45) Date of Patent: Jan. 8, 2013

(54) MULTI-STAGE RECEIVER

(75) Inventor: Yu Meng Chuang, Taoyuan (TW)

(73) Assignee: Nanya Technology Corp., Kueishan, Tao-Yuan Hsien (TW)

(*) Notice: Subject to any disclaimer, the term of this patent is extended or adjusted under 35 U.S.C. 154(b) by 27 days.

(21) Appl. No.: 13/090,727

(22) Filed: Apr. 20, 2011

(65) Prior Publication Data

US 2012/0269296 A1    Oct. 25, 2012

(51) Int. Cl.
*H03K 5/22* (2006.01)
(52) U.S. Cl. .......................... 327/65; 327/170
(58) Field of Classification Search .................. None
See application file for complete search history.

(56) References Cited

U.S. PATENT DOCUMENTS 7,961,011 B2 * 6/2011 Iwamatsu et al. ............... 327/65
7,994,807 B1 * 8/2011 Koh et al. ................... 324/750.3

* cited by examiner

*Primary Examiner* — Lincoln Donovan
*Assistant Examiner* — Sibin Chen
(74) *Attorney, Agent, or Firm* — Hamre, Schumann, Mueller & Larson, P.C.

(57) ABSTRACT

A multi-stage receiver comprises an input stage, an intermediate stage, and an output stage. The input stage is configured to provide a first signal and a second signal. The intermediate stage is coupled to the input stage and comprises a first amplifying circuit and a second amplifying circuit. Positive and negative input terminals of the first amplifying circuit receive the first signal and the second signal, respectively. Positive and negative input terminals of the second amplifying circuit receive the second signal and the first signal, respectively. The output stage is coupled to the intermediate stage and configured to generate low-skewed differential signals according to output signals of the intermediate stage.

11 Claims, 7 Drawing Sheets

US 8,350,598 B2

MULTI-STAGE RECEIVER

TECHNICAL FIELD

The present invention relates to a multi-stage receiver, and more particularly, to a multi-stage receiver for high speed applications of semiconductor memory devices.

BACKGROUND

In semiconductor devices, input receivers are widely used to receive input signals from outside of the devices. With recent increases in the operation speed of semiconductor devices, there is a need to increase the sensing speed of input receivers. In the field of memory devices, as data transfer speeds increase, a double data rate (DDR) semiconductor memory device has been developed. The DDR semiconductor memory device employs a rising edge and a falling edge of a clock signal to process data so as to increase the operation speed of devices.

FIG. 1 is a circuit diagram illustrating an input receiver 10 used in a DDR semiconductor memory device. Referring to FIG. 1, the input receiver 10 comprises a pre-amplifier 12, a sense amplifier 14, and a latch circuit 16. The pre-amplifier 12 amplifies an input signal IN, from outside of the memory device, with reference to a reference voltage VREF. The pre-amplifier 12 typically comprises a differential pair of PMOS transistors for receiving input signals. The sense amplifier 14 amplifies an output signal OUT1 and an inverted output signal OUT2 of the pre-amplifier 12 in response to a rising edge of a clock signal CLK. The latch circuit 16 latches an output signal OUT3 and an inverted output signal OUT4 of the sense amplifier 14 so as to generate a final output signal OUT and an inverted final output signal OUTB to other circuits in the DDR semiconductor memory device.

Currently, DDR semiconductor memory devices are divided into three types: DDR1, DDR2, and DDR3, with maximum operating frequencies of 400 MHz, 800 MHz, and 1.6 GHz, respectively. As the operation frequencies of memory devices increase from generation to generation, the prior art input receiver cannot respond immediately, and the output signal OUT and the inverted final output signal OUTB may have a skewed phenomenon as shown in FIG. 2. One consequence of the skew is that the signals OUT and OUTB do not cross the midpoint $V_{MID}$ at the same time. Instead, the midpoint crossings are offset by a skew time Td, which is typically on the order of 50 picoseconds or more. Such skew times are unacceptable for optimal differential signal processing, particularly with high speed applications.

Therefore, there is a need to provide a multi-stage receiver that exhibits low skew for high speed applications.

SUMMARY

One aspect of the present invention provides a multi-stage receiver for high speed applications of semiconductor memory devices. The multi-stage receiver is configured to generate differential signals for a succeeding stage.

In one embodiment of the present invention, the multi-stage receiver comprises an input stage, an intermediate stage, and an output stage. The input stage is configured to provide a first signal and a second signal. The intermediate stage is coupled to the input stage and comprises a first amplifying circuit and a second amplifying circuit. The first amplifying circuit has a positive input terminal configured to receive the first signal, a negative input terminal configured to receive the second signal, and an output terminal configured to generate a first skewed signal. The second amplifying circuit has a positive input terminal configured to receive the second signal, a negative input terminal configured to receive the first signal, and an output terminal configured to generate a second skewed signal.

The output stage is coupled to the intermediate stage and configured to generate the differential signals. The output stage has a first input terminal configured to receive the first skewed signals, a second input terminal configured to receive the second skewed signals, a first output terminal configured to generate a first output signal according to the first and second skewed signals, and a second output terminal configured to generate a second output signal according to the first and second skewed signals.

The foregoing has outlined rather broadly the features and technical advantages of the present invention in order that the detailed description of the invention that follows may be better understood. Additional features and advantages of the invention will be described hereinafter, and form the subject of the claims of the invention. It should be appreciated by those skilled in the art that the conception and specific embodiment disclosed may be readily utilized as a basis for modifying or designing other structures or processes for carrying out the same purposes as those of the present invention. It should also be realized by those skilled in the art that such equivalent constructions do not depart from the spirit and scope of the invention as set forth in the appended claims.

BRIEF DESCRIPTION OF THE DRAWINGS

The accompanying drawings, which are incorporated in and constitute a part of this specification, illustrate embodiments of the disclosure and, together with the description, serve to explain the principles of the invention.

DETAILED DESCRIPTION

Figure 1:
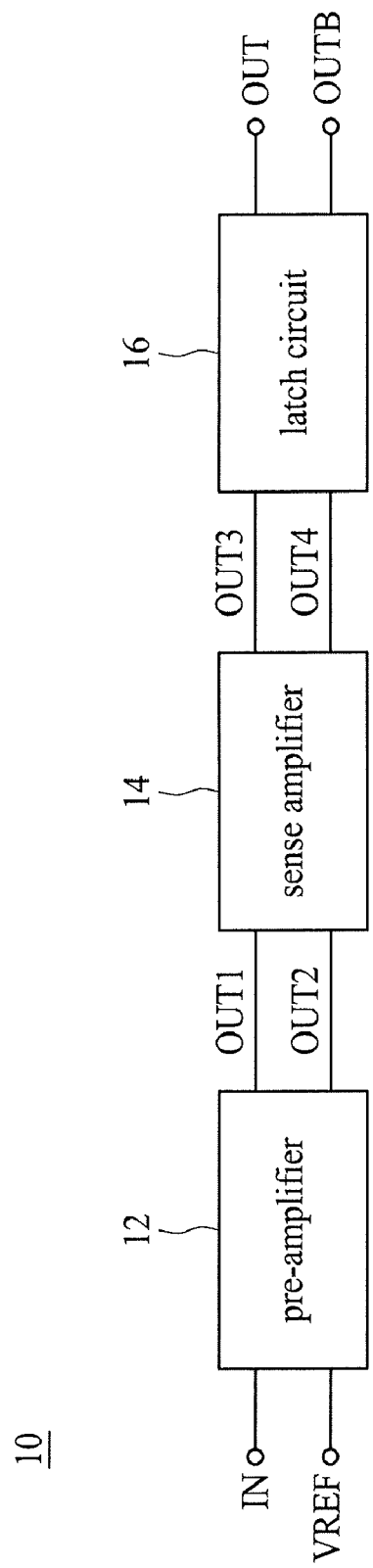
FIG. 1 is a circuit diagram illustrating a prior art input receiver used in DDR semiconductor memory devices.
Figure 2:
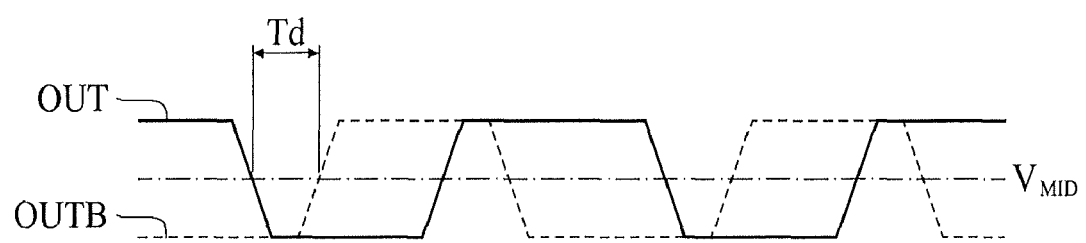
FIG. 2 shows a skewed phenomenon of the output signals.
Figure 3:
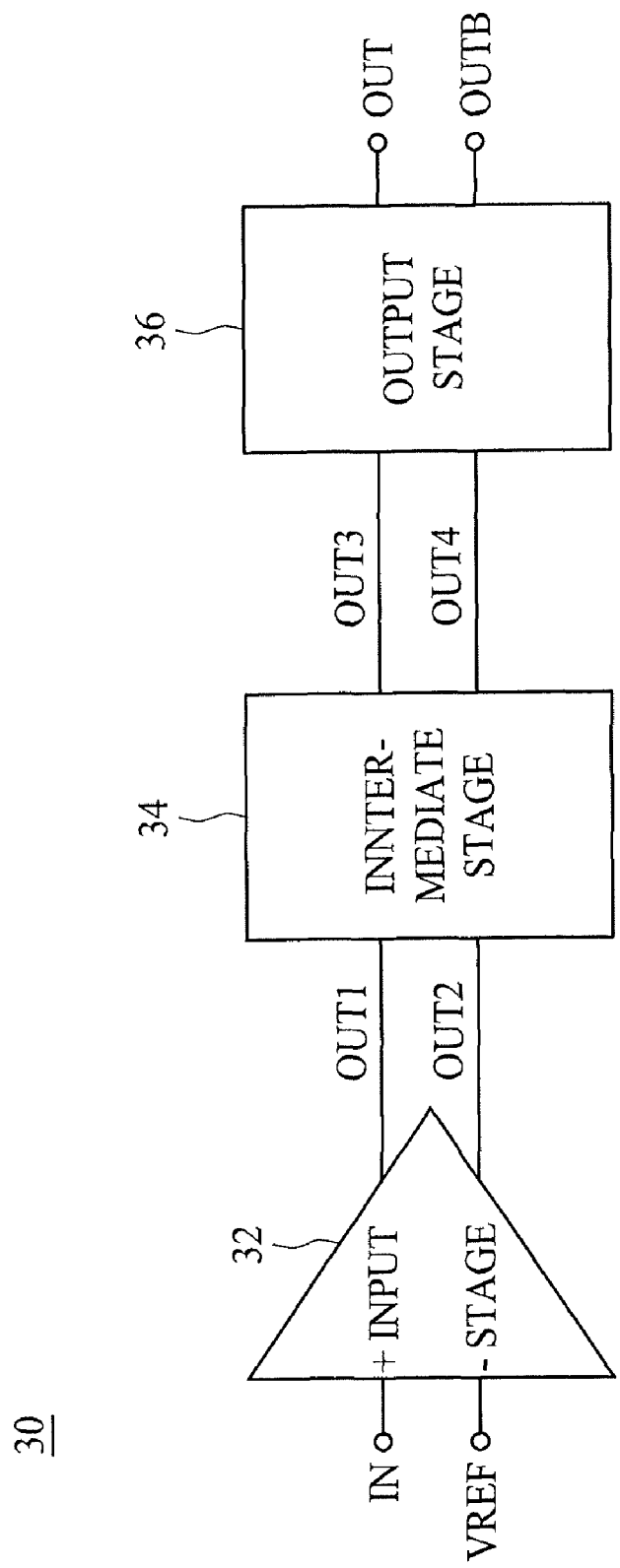
FIG. 3 shows a block diagram of a multi-stage receiver according to one embodiment of the present invention.

FIG. 3 shows a block diagram of a receiver 30 according to one embodiment of the present invention. The receiver 30 amplifies an input signal IN, from outside of the receiver, with reference to a reference voltage VREF so as to generate differential output signals OUT and OUTB. As show in FIG. 3, the receiver 30 is a multi-stage device including an input stage 32, an intermediate stage 34, and an output stage 36, wherein the intermediate stage 34 is electrically coupled between the input stage 32 and the output stage 36.

Figure 4:
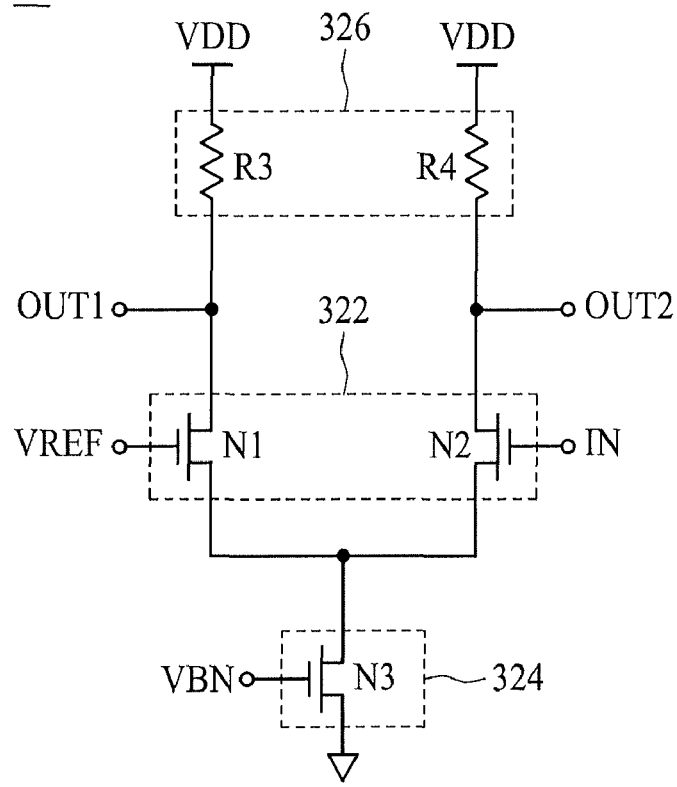
FIG. 4 is a schematic diagram of the input stage in accordance with one embodiment of the present invention.

FIG. 4 is a schematic diagram of the input stage 32 in accordance with one embodiment of the invention. Referring to FIG. 4, the input stage 32 comprises a differential pair 322 of NMOS transistors N1 and N2, a current source 324, and a load resistance section 326. The sources of the NMOS transistors N1 and N2 are coupled to each other to constitute the differential pair 322, and the gates of the NMOS transistors N1 and N2 are configured to receive the reference voltage VREF and the input voltage IN, respectively.

The current source 324 is coupled between the ground node GROUND and the differential pair 322. In one embodiment of the present invention, the current source 324 is implemented as an NMOS transistor N3. The load resistance section 326 is coupled between the supply voltage source VDD and the differential pair 322. In one embodiment of the present invention, the load resistance section 326 is composed of two resistors R3 and R4.

Referring to FIG. 4, the signals OUT1 and OUT2 are sent from the output terminals of the input stage 32. The output signals OUT1 and OUT2 are differential signals. That is, the output signal OUT2 is an inverted signal of the output signal OUT1. Referring to FIG. 4, the input stage 32 comprises a differential pair 322 of NMOS transistors N1 and N2. However, the present invention is not limited to this embodiment. The input stage 32 can be any suitable differential input stage.

Figure 5:
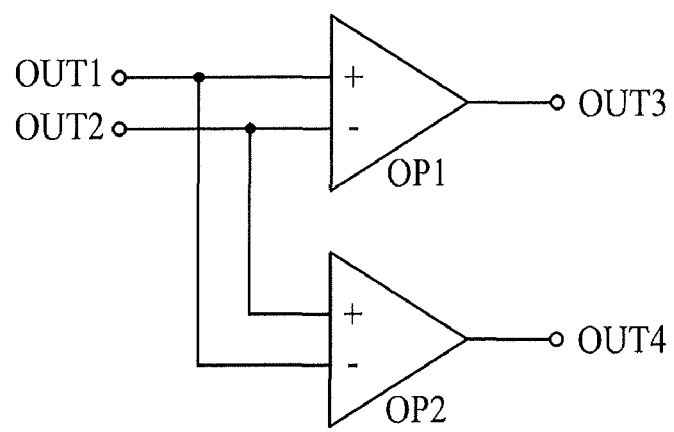
FIG. 5 is a block diagram of the intermediate stage in accordance with one embodiment of the present invention.

FIG. 5 is a block diagram of the intermediate stage 34 in accordance with one embodiment of the invention. In order to further amplify the signals OUT1 and OUT2, the intermediate stage 34 is configured to receive the signals OUT1 and OUT2 and amplify the difference between the signals OUT1 and OUT2 in an amplification factor. The intermediate stage 34 comprises a first amplifying circuit OP1 and a second amplifying circuit OP2. The amplifying circuits OP1 and OP2 can be any suitable differential input amplifier. In a preferred embodiment, the circuit arrangement of the second amplifying circuit OP2 is the same as that of the first amplifying circuit OP1, and thus the characteristics of the amplifying circuits OP1 and OP2, such as the frequency response and the amplification factor, are the same.

Figure 6:
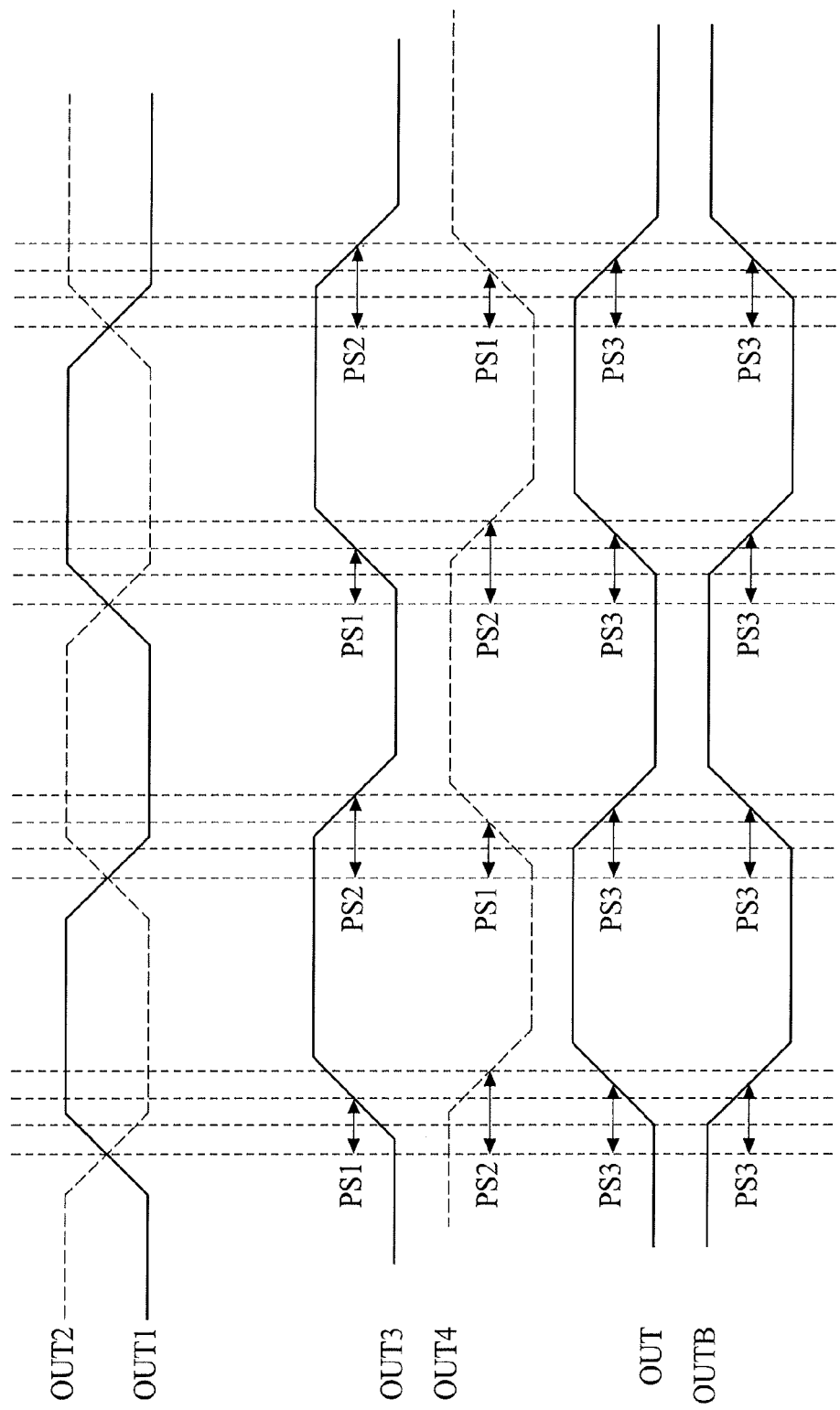
FIG. 6 is a set of waveforms showing signals OUT1, OUT2, OUT3, OUT4, OUT and OUTB in accordance with one embodiment of the present invention.

Referring to FIG. 5, the first amplifying circuit OP1 has a positive input terminal and a negative input terminal which receive the signals OUT1 and OUT2 from the input stage 32, respectively. In operation, the first amplifying circuit OP1 amplifies the signal OUT1 with reference to the signal OUT2 to generate a skewed signal OUT3 from its output terminal. Therefore, an output waveform of the skewed signal OUT3 has substantially the same shape as a waveform of the signal OUT1, but lags the waveform of the signal OUT1 by an amount of phase shift PS1 as shown in FIG. 6.

The second amplifying circuit OP2 has a positive input terminal and a negative input terminal which receive the signals OUT2 and OUT1 from the input stage 32, respectively. In operation, the second amplifying circuit OP2 amplifies the signal OUT2 with reference to the signal OUT1 to generate a skewed signal OUT4 from its output terminal. Therefore, an output waveform of the skewed signal OUT4 has substantially the same shape as a waveform of the signal OUT2, but lags the waveform of the signal OUT2 by an amount of phase shift PS2 as shown in FIG. 6.

Figure 7:
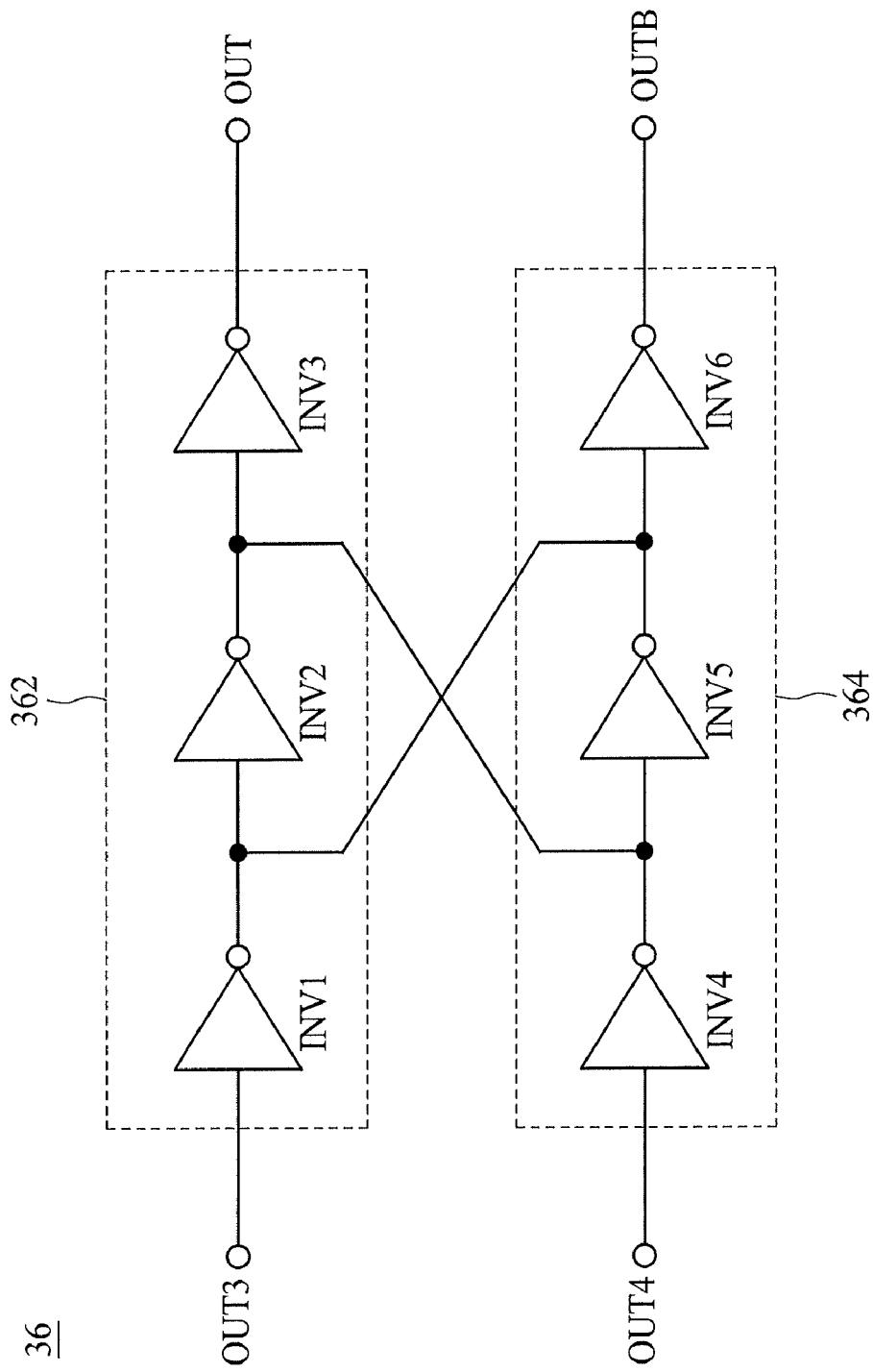
FIG. 7 is a circuit diagram of the output stage in accordance with one embodiment of the present invention.

FIG. 7 is a circuit diagram of the output stage 36 in accordance with one embodiment of the present invention. In order to produce differential signals with lower skew times, the output stage 36 performs a phase shifting operation so as to compensate the skew time between the skewed signals OUT3 and OUT4. The output stage 36 is coupled to the intermediate stage 34 and has first and second input terminals for receiving the skewed signals OUT3 and OUT4, respectively. In operation, the output stage 36 generates the final output signal OUT according to both skewed signals OUT3 and OUT4, and generates the final output signal OUTB according to both skewed signals OUT3 and OUT4. The output signal OUTB is an inverted signal of the signal OUT. That is, the output signals OUT and OUTB are differential signals with low skew.

Referring to FIG. 7, the output stage 36 comprises a first inverter chain 362 and a second inverter chain 364. The first inverter chain 362 includes a plurality of inverters connected in series between the first input terminal and the first output terminal of the output stage 36, and the second inverter chain 364 includes a plurality of inverters connected in series between the second input terminal and the second output terminal of the output stage 36. In one embodiment of the present invention, each inverter chain composed of three-stage inverters is explained herein.

Referring to FIG. 7, the first inverter chain 362 is composed of three inverters INV1, INV2, and INV3, which are connected in series, and the second inverter chain 364 is composed of three inverters INV4, INV5, and INV6, which are connected in series. The inverter INV1 has an input terminal for receiving the skewed signal OUT3 and an output terminal of the inverter INV1 is connected to an output terminal of the inverter INV5. The inverter INV4 has an input terminal for receiving the skewed signal OUT4, and an output terminal of the inverter INV4 is connected to an output terminal of the inverter INV2.

During transitions of the skewed signals OUT3 and OUT4, the output signals of the inverter INV1 and the inverter INV4 change logic states after a short delay time, respectively. Because the output terminal of the inverter INV1 is connected to the input terminal of the inverter INV6 and the output terminal of the inverter INV2 is connected to the input terminal of the inverter INV5, the output signal OUTB changes logic states according to both skewed signals OUT3 and OUT4. Similarly, since the output terminal of the inverter INV4 is connected to the input terminal of the inverter INV3 and the output terminal of the inverter INV5 is connected to the input terminal of the inverter INV2, the output signal OUT changes logic states according to both skewed signals OUT3 and OUT4. Therefore, the skew time between the output signals OUT and OUTB can be reduced because the skewed signals OUT3 and OUT4 are delayed and injected into the first inverter chain 362 and the second inverter chain 364.

Referring to FIG. 7, the number of the inverters in the inverter chain 362 is the same as that of the inverters in the inverter chain 364. However, the present invention is not limited to this embodiment. In a preferred embodiment, the inverter chain 362 and the inverter chain 364 have same drive strength, and thus the propagation time of the inverter chain 362 is substantially equal to that of the inverter chain 364.

Figure 8:
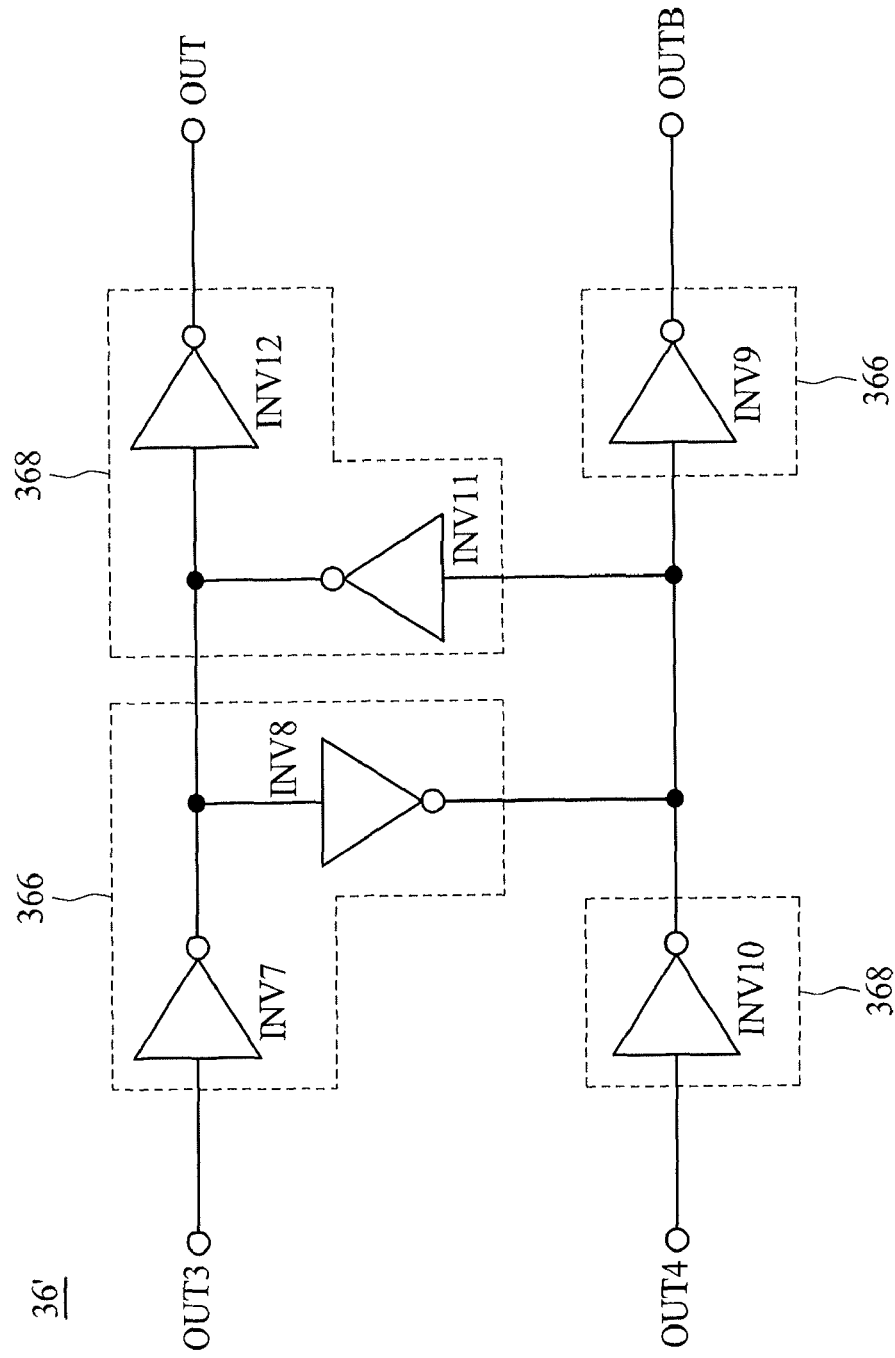
FIG. 8 is a circuit diagram of the output stage in accordance with another embodiment of the present invention.

The output stage 36 can be implemented in other structures based on the same principle. FIG. 8 is a circuit diagram of the output stage 36' in accordance with another embodiment of the present invention. Referring to FIG. 8, the output stage 36' comprises an inverter chain 366 and an inverter chain 368. The inverter chain 366 includes inverters INV7, INV8, and INV9, which are connected in series between the first input terminal and the second output terminal, and the inverter chain 368 includes inverters INV10, INV11, and INV12, which are connected in series between the second input terminal and the first output terminal.

Referring to FIG. 8, the inverter INV7 has an input terminal for receiving the skewed signal OUT3, and the inverter INV10 has an input terminal for receiving the skewed signal OUT4. The inverter INV12 has an output terminal for generating the output signal OUT, and the inverter INV9 has an output terminal for generating the output signal OUTB.

During transitions of the skewed signals OUT3 and OUT4, the output signals of the inverter INV7 and the inverter INV10 change logic states after a short delay time. Because the output terminal of the inverter INV8 is connected to the input terminal of the inverter INV9, the output signal OUTB changes logic states according to both skewed signals OUT3 and OUT4. Similarly, since the output terminal of the inverter INV11 is connected to the input terminal of the inverter INV12, the output signal OUT changes logic states according to both skewed signals OUT3 and OUT4. Therefore, the skew time between the output signals OUT and OUTB can be reduced because the skewed signals OUT3 and OUT4 are delayed and injected into the inverter chain 366 and the inverter chain 368.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

What is claimed is:

1. A multi-stage receiver for generating differential signals, comprising:
    an input stage configured to provide a first signal and a second signal, and the second signal being an inverted signal of the first signal;
    an intermediate stage coupled to the input stage, the intermediate stage comprising:
        a first amplifying circuit having a positive input terminal configured to receive the first signal, a negative input terminal configured to receive the second signal, and an output terminal configured to generate a first skewed signal; and
        a second amplifying circuit having a positive input terminal configured to receive the second signal, a negative input terminal configured to receive the first signal, and an output terminal configured to generate a second skewed signal; and
    an output stage coupled to the intermediate stage and configured to generate the differential signals, the output stage having a first input terminal configured to receive the first skewed signal, a second input terminal configured to receive the second skewed signal, a first output terminal configured to generate a first output signal according to the first and second skewed signals, and a second output terminal configured to generate a second output signal according to the first and second skewed signals.

2. The multi-stage receiver of claim 1, wherein the circuit arrangement of the second amplifying circuit is the same as that of the first amplifying circuit.

3. The multi-stage receiver of claim 1, wherein the output stage further comprises:
    a first inverter chain including a plurality of inverters coupled in series between the first input terminal and the first output terminal; and
    a second inverter chain including a plurality of inverters coupled in series between the second input terminal and the second output terminal;
    wherein an output terminal of at least one inverter in the first inverter chain is coupled to an input terminal of at least one inverter in the second inverter chain, and an output terminal of at least one inverter in the second inverter chain is coupled to an input terminal of at least one inverter in the first inverter chain.

4. The multi-stage receiver of claim 3, wherein the number of the inverters in the first inverter chain is the same as that of the inverters in the second inverter chain.

5. The multi-stage receiver of claim 3, wherein the first inverter chain and the second inverter chain have same drive strength.

6. The multi-stage receiver of claim 3, wherein the first inverter chain and the second inverter chain each comprise at least one capacitor coupled to a common node.

7. The multi-stage receiver of claim 3, wherein the first inverter chain has a first inverter and a second inverter coupled in series, and the second inverter chain has a third inverter and a fourth inverter coupled in series, and wherein an input terminal of the first inverter receives the first skewed signal, an output terminal of the first inverter is coupled to an output terminal of the fourth inverter, an input terminal of the third inverter receives the second skewed signal, and an output terminal of the third inverter is coupled to an output terminal of the second inverter.

8. The multi-stage receiver of claim 1, wherein the output stage further comprises:
    a first inverter chain including a plurality of inverters coupled in series between the first input terminal and the second output terminal; and
    a second inverter chain including a plurality of inverters coupled in series between the second input terminal and the first output terminal,
    wherein an output terminal of at least one inverter in the first inverter chain is coupled to an input terminal of at least one inverter in the second inverter chain, and an output terminal of at least one inverter in the second inverter chain is coupled to an input terminal of at least one inverter in the first inverter chain.

9. The multi-stage receiver of claim 8, wherein the number of the inverters in the first inverter chain is the same as that of the inverters in the second inverter chain.

10. The multi-stage receiver of claim 8, wherein the first inverter chain and the second inverter chain have same drive strength.

11. The multi-stage receiver of claim 8, wherein the first inverter chain has a first inverter and a second inverter coupled in series, and the second inverter chain has a third inverter and a fourth inverter coupled in series, and wherein an input terminal of the first inverter receives the first skewed signal, an output terminal of the second inverter is coupled to an output terminal of the third inverter, an input terminal of the third inverter receives the second skewed signal, and an output terminal of the fourth inverter is coupled to an output terminal of the first inverter.

* * * * *